(12) United States Patent
Ha et al.

(10) Patent No.: US 12,195,488 B2
(45) Date of Patent: Jan. 14, 2025

(54) ORGANOMETALLIC COMPOUNDS AND THIN FILM USING SAME

(71) Applicant: Merck Patent GmbH, Darmstadt (DE)

(72) Inventors: Seung Won Ha, Daejeon (KR); Young Hun Byun, Gyeonggi-do (KR); Jeum Jong Kim, Chungcheongnam-do (KR); Ho Hoon Kim, Chungcheongbuk-do (KR); Seong Hak Cheon, Chungcheongbuk-do (KR)

(73) Assignee: Merck Patent GMBH, Darmstadt (DE)

( * ) Notice: Subject to any disclaimer, the term of this patent is extended or adjusted under 35 U.S.C. 154(b) by 1053 days.

(21) Appl. No.: 16/968,492

(22) PCT Filed: Jan. 25, 2019

(86) PCT No.: PCT/KR2019/001062
§ 371 (c)(1),
(2) Date: Aug. 7, 2020

(87) PCT Pub. No.: WO2019/156400
PCT Pub. Date: Aug. 15, 2019

(65) Prior Publication Data
US 2020/0407380 A1      Dec. 31, 2020

(30) Foreign Application Priority Data

Feb. 8, 2018   (KR) .................. 10-2018-0015715

(51) Int. Cl.
*C07F 9/00*   (2006.01)
*H01L 21/02*  (2006.01)

(52) U.S. Cl.
CPC .......... *C07F 9/00* (2013.01); *H01L 21/02183* (2013.01); *H01L 21/0228* (2013.01)

(58) Field of Classification Search
CPC ......... C07F 9/00; C23C 16/34; C23C 16/455; H01L 21/02; H01L 21/02183
See application file for complete search history.

(56) References Cited

U.S. PATENT DOCUMENTS

| 2019/0135840 A1 | 5/2019 | Kim et al. |
| 2019/0202847 A1 | 7/2019 | Han et al. |

FOREIGN PATENT DOCUMENTS

| KR | 10-2006-0046471 | 5/2006 |
| KR | 10-2010-0060481 | 6/2010 |
| KR | 10-2011-0081181 | 7/2011 |
| KR | 10-2013-0049020 | 5/2013 |
| KR | 10-1263454 | 11/2013 |
| KR | 10-2017-0127990 | 11/2017 |
| WO | WO 2010/040741 | 4/2010 |
| WO | WO 2017/179857 | 10/2017 |
| WO | WO 2018/048124 | 3/2018 |

OTHER PUBLICATIONS

Hughes (J. Chem. Soc., Dalton Trans., 1997, pp. 4139-4141).*

* cited by examiner

*Primary Examiner* — Pancham Bakshi
(74) *Attorney, Agent, or Firm* — Morrison & Foerster LLP

(57) ABSTRACT

According to the organometallic compound of the present invention and the thin film manufactured using the same, requirements of high volatility and excellent chemical/thermal stability are satisfied, and significantly improved thin-film deposition rates are exhibited even at low temperatures. In addition, property degradation due to by-products can be improved, excellent step coverage can be realized, and a thin film which, due to having a high dielectric constant, electrically satisfies the equivalent oxide thickness (EOT) requirement while having a thickness at which tunneling does not physically occur can be implemented.

2 Claims, 4 Drawing Sheets

ORGANOMETALLIC COMPOUNDS AND THIN FILM USING SAME

CROSS REFERENCE TO RELATED APPLICATIONS

This application is a national stage application under 35 U.S.C. § 371 of International Application No. PCT/KR2019/001062, filed internationally on Jan. 25, 2019, which claims priority to Korean Patent Application No. 10-2018-0015715, filed Feb. 8, 2018, the contents of which are incorporated herein by reference in their entirety.

TECHNICAL FIELD

The present invention relates to an organometallic compound and a thin film manufactured using the same, and more particularly, to an organometallic compound and a thin film manufactured using the same, which satisfy requirements of high volatility and excellent chemical/thermal stability, and at the same time, exhibit significantly improved thin-film deposition rates even at low temperatures.

BACKGROUND ART

Recently, the application of various thin films such as metals, semiconductors, and oxides have been studied for the manufacture of nanoscale integrated devices. In the process of forming these various thin films, as devices continue to be downsized and new types of devices are constantly being proposed, both the necessity of a process capable of depositing a thin film onto a construct having nanoscale complexity while controlling a thickness at an atomic-layer level and the importance of conformality are increasing. The gate oxide used in the gate structure of a metal-oxide-semiconductor field-effect transistor (MOSFET) which is the core of an electronic device is based on silicon oxide. However, as devices are downsized to the nanoscale, problems such as an increase in leakage current and the formation of a gate depletion layer arise, and in order to solve these problems, many attempts have been made to use new oxides having high dielectric constants. Among the various oxides having high dielectric constants, $HfO_xN_y$ which is $HfO_2$-based and nitrogen-doped, $HfSi_xO_y$ which is a silicate material, and the like have been most researched, and even though the application of these materials has had good results in terms of improving charge mobility and reliability, problems such as an increase in dielectric constants or problems in thermal stability and interfacial properties and the like have not been solved. In order to solve these problems, research is underway with a focus on high dielectric constant thin-film deposition processes using atomic layer deposition, characteristics thereof, development of various high dielectric constant material deposition processes, development of new processes, and application to nanodevices.

Among the precursors for depositing metal thin films, metal oxides, or metal nitrides using an organometallic chemical vapor deposition method or an atomic layer deposition method, the most representative are metal pentachlorides ($MCl_5$ (M=V, Nb, Ta)), which are metal halide-based compounds. However, the metal pentachlorides have problems in that 1) they are not readily applicable to semiconductor mass production processes because they are in a solid state having a low vapor pressure at room temperature and thus have a low film deposition rate and 2) there is a risk of contamination by a chloride.

Meanwhile, metal alkoxide-based compounds are representative precursor compounds for depositing metal oxides. In particular, metal ethoxide precursor compounds represented by the formula $M_2(OEt)_{10}$ (M=Nb, Ta) are present as highly volatile liquids at room temperature and thus have been most widely used for depositing metal oxide films using metal organic chemical vapor deposition (MOCVD) and atomic layer deposition (ALD) processes. However, the metal alkoxide compounds have problems in that 1) the precursor which has low thermal stability is decomposed during deposition when the substrate temperature is 300° C. or more, providing poor step coverage and 2) there is a risk of increased contamination by carbon.

In addition, metal imido/amide-based compounds have problems in that 1) the ALD process is only possible at temperatures below 325° C., 2) the thin films have low crystallinity, 3) the films being deposited are highly contaminated due to carbon and the like, and in particular, 4) leakage currents are rather high for use as gate and capacitor dielectric materials in flash memory applications as well as in sub-50 nm DRAM processes.

In addition, recently, the use of Cu wiring films as wiring films for semiconductor integrated circuits is being expanded. However, in the Cu wiring film forming process for front devices after the 32 nm node, it is difficult to embed Cu into holes and trenches by the current plating method. This is because the barrier metal film required as a base layer of the Cu wiring film is currently formed by the physical vapor deposition (PVD) method, so that it is difficult for the downsizing thereof to be achieved and a satisfactory base layer cannot be obtained. For this reason, it is currently required for the barrier metal film to be ultra-thin or have excellent barrier properties in addition to providing high coverage for high aspect ratio holes, trenches, and the like.

DISCLOSURE

Technical Problem

The present invention is directed to providing an organometallic compound and a thin film manufactured using the same which satisfy requirements of high volatility and excellent chemical/thermal stability, and at the same time, exhibit significantly improved thin-film deposition rates even at low temperatures.

Technical Solution

One aspect of the present invention provides an organometallic compound, which may have a structure represented by the following Chemical Formula 1.

[Chemical Formula 1]

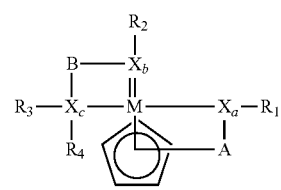

In Chemical Formula 1, M is selected from among Group 5 transition metals; $X_a$, $X_b$, and $X_c$ are each independently O, N, P, As, or —P═O; $R_1$, $R_2$, $R_3$, and $R_4$ are each independently hydrogen or a $C_{1-9}$ alkyl group or heteroalkyl group, and $R_1$, $R_2$, $R_3$, and $R_4$ are present or not present depending on the valency of $X_a$, $X_b$, and $X_c$; and A and B are each independently a $C_{1-9}$ alkylene group or heteroalkylene group, and B is present or not present depending on the valency of $X_b$ and $X_c$.

According to one embodiment of the present invention, the Group 5 transition metal of Chemical Formula 1 may include any one of V, Nb, and Ta.

According to one embodiment of the present invention, the $X_a$, $X_b$, and $X_c$ of Chemical Formula 1 may be each independently O or N, and $R_1$, $R_2$, $R_3$, and $R_4$ may be each independently hydrogen or a $C_{1-6}$ alkyl group.

According to one embodiment of the present invention, the A and B of Chemical Formula 1 may be each independently a $C_{1-3}$ alkylene group or heteroalkylene group.

In addition, the organometallic compound of the present invention may have a structure represented by the following Chemical Formula 2.

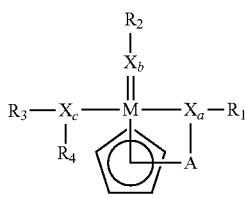

[Chemical Formula 2]

In Chemical Formula 2, M is selected from among Group 5 transition metals; $X_a$, $X_b$, and $X_c$ are each independently O, N, P, As, or —P═O; $R_1$, $R_2$, $R_3$, and $R_4$ are each independently hydrogen or a $C_{1-9}$ alkyl group or heteroalkyl group, and $R_1$, $R_2$, $R_3$, and $R_4$ are present or not present depending on the valency of $X_a$, $X_b$, and $X_c$; and A is a $C_{1-9}$ alkylene group or heteroalkylene group.

According to one embodiment of the present invention, the Group 5 transition metal of Chemical Formula 2 may be any one of V, Nb, and Ta, $X_a$, $X_b$, and $X_c$ may be each independently O or N, $R_1$, $R_2$, $R_3$, and $R_4$ may be each independently hydrogen or a $C_{1-6}$ alkyl group, and A may be a $C_{1-3}$ alkylene group or heteroalkylene group.

In addition, the organometallic compound of the present invention may have a structure represented by the following Chemical Formula 3.

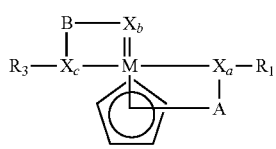

[Chemical Formula 3]

In Chemical Formula 3, M is selected from among Group 5 transition metals; $X_a$ and $X_c$ are each independently O, N, P, As, or —P═O; $X_b$ is N, P, As, or —P═O; $R_1$ and $R_3$ are each independently hydrogen or a $C_{1-9}$ alkyl group or heteroalkyl group, and $R_1$ and $R_3$ are present or not present depending on the valency of $X_a$ and $X_c$; and A and B are each independently a $C_{1-9}$ alkylene group or heteroalkylene group.

According to one embodiment of the present invention, the Group 5 transition metal of Chemical Formula 3 may be any one of V, Nb, and Ta, $X_a$ and $X_c$ may be each independently O or N, $X_b$ may be N, $R_1$ and $R_3$ may be each independently hydrogen or a $C_{1-6}$ alkyl group, and A and B may be each independently a $C_{1-3}$ alkylene group or heteroalkylene group.

In addition, the organometallic compound of the present invention may have a structure represented by the following Chemical Formula 4.

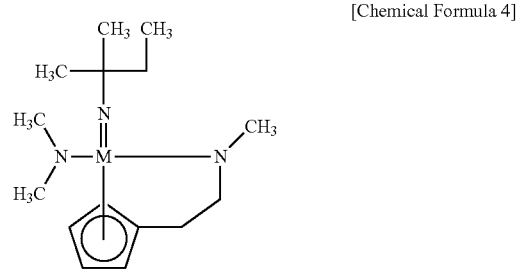

[Chemical Formula 4]

In Chemical Formula 4, M includes Nb or Ta.

Another aspect of the present invention provides a metal-containing semiconductor thin film manufactured using one or more selected from among the organometallic compounds of Chemical Formula 1 to Chemical Formula 4 as a precursor.

Still another aspect of the present invention provides a semiconductor construct including a metal-containing semiconductor thin film.

Hereinafter, terms used herein will be briefly described.

The term "alkyl" refers to an aliphatic hydrocarbon group. The alkyl moiety may be a "saturated alkyl" group, which means that it does not contain any alkene or alkyne moieties. The alkyl moiety may also be an "unsaturated alkyl" moiety, which means that it contains at least one alkene or alkyne moiety. The "alkene" moiety refers to a group in which at least two carbon atoms are bonded by at least one carbon-carbon double bond, and the "alkyne" moiety refers to a group in which at least two carbon atoms are bonded by at least one carbon-carbon triple bond. The alkyl moiety, whether saturated or unsaturated, may be branched, straight-chained, or cyclic. Also, the term "alkyl" encompasses both "substituted and unsubstituted alkyls".

The meaning of the term "substituted or unsubstituted" encompasses both the case where a compound of interest is substituted and the case where a compound of interest is not substituted unless otherwise specified, and when a compound of interest is substituted, the case where the substituent is one or more groups individually and independently selected from among alkyl, acyl, cycloalkyl (including dicycloalkyl and tricycloalkyl), perhaloalkyl, aryl, heteroaryl, heteroalicyclic, hydroxy, alkoxy, azide, amine, ketone, ether, amide, ester, triazole, isocyanate, arylalkyloxy, aryloxy, mercapto, alkylthio, arylthio, cyano, halogen, carbonyl, thiocarbonyl, O-carbamyl, N-carbamyl, O-thiocarbamyl, N-thiocarbamyl, C-amido, N-amido, S-sulfonamido, N-sulfonamido, C-carboxy, O-carboxy, isocyanato, thiocyanato, isothiocyanato, nitro, cyryl, trihalomethanesulfonyl, pyrrolidinone, pyrrolidine, piperidine, piperazine, morpholine, amine, amino, amido, halogen, thiol, aldehyde, carbonyl, phosphorus, sulfur, phosphate, phosphite, sulfate, disulfide, oxy, and mercapto groups, amino groups including hydrocarbyl mono- and di-substituted amino groups, and protective derivatives thereof is encompassed, but the present invention is not limited thereto, and all the cases where the substituent is selected from among the various substituents commonly used in the art are encompassed. In some cases, the substituent itself may also be substituted or unsubstituted.

The term "heteroatom" refers to an atom other than carbon and hydrogen.

The term "heteroalkyl" refers to a form in which one or more carbon atoms of an alkyl group are substituted with a heteroatom.

The expression "depending on the valency (of an atom)" means that the valency of the atom is satisfied, and the expression "the valency (of an atom) is satisfied" means a state in which a specific number of electrons have entered the outermost shell of the atom so that the bound atom is present in the most stable condition.

Advantageous Effects

According to the organometallic compound of the present invention and the thin film manufactured using the same, requirements of high volatility and excellent chemical/thermal stability are satisfied, and at the same time, significantly improved thin-film deposition rates are exhibited even at low temperatures. In addition, property degradation due to by-products can be improved, excellent step coverage can be realized, and a thin film which, due to having a high dielectric constant, electrically satisfies the equivalent oxide thickness (EOT) requirement while having a thickness at which tunneling does not physically occur can be implemented.

MODES OF THE INVENTION

Figure 1A:
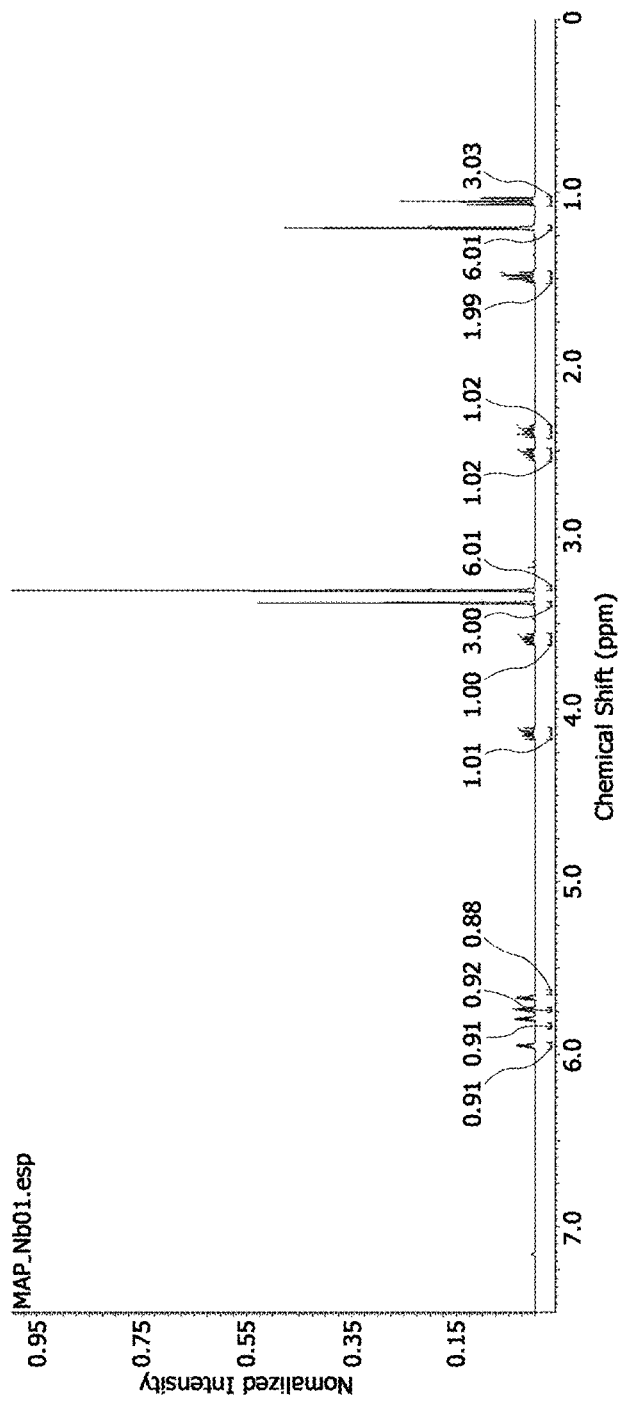
FIGS. 1A and 1B show the $^1$H-NMR and $^{13}$C-NMR measurement data of Map-Nb01 prepared in Example 1, respectively.

Hereinafter, exemplary embodiments of the present invention will be described in detail with reference to the accompanying drawings so that those skilled in the art to which the present invention pertains can easily carry out the embodiments. However, the embodiments are not intended to limit the scope of the present invention and should be construed as being provided to facilitate understanding of the present invention.

As described above, the conventional metal pentachlorides, metal alkoxide compounds, or metal imido/amide-based compounds have problems in that the compounds are in a solid state having a low vapor pressure at room temperature and thus have a low film deposition rate and are not readily applicable to semiconductor mass production processes, the precursor which has low thermal stability is decomposed during deposition and provides poor step coverage when the substrate temperature is high, or a film being processed or deposited is highly contaminated, which means that the process has low reliability and low efficiency.

Accordingly, the present invention seeks to solve the above-described problems by providing an organometallic compound having a structure represented by Chemical Formula 1. The organometallic compound has an effect of satisfying requirements of high volatility and excellent chemical/thermal stability and, at the same time, significantly improving thin-film deposition rates even at low temperatures. In addition, the organic compound has an effect of improving property degradation due to by-products, realizing excellent step coverage, and implementing a thin film which, due to having a high dielectric constant, electrically satisfies the equivalent oxide thickness (EOT) requirement while having a thickness at which tunneling does not physically occur.

One aspect of the present invention provides an organometallic compound having a structure represented by the following Chemical Formula 1.

[Chemical Formula 1]

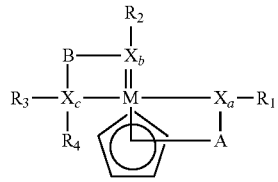

In Chemical Formula 1, M is selected from among Group 5 transition metals, $X_a$, $X_b$, and $X_c$ are each independently O, N, P, As, or —P=O, $R_1$, $R_2$, $R_3$, and $R_4$ are each independently hydrogen or a $C_{1-9}$ alkyl group or heteroalkyl group, and $R_1$, $R_2$, $R_3$, and $R_4$ are present or not present depending on the valency of $X_a$, $X_b$, and $X_c$, and A and B are each independently a $C_{1-9}$ alkylene group or heteroalkylene group, and B is present or not present depending on the valency of $X_b$ and $X_c$.

M is a Group 5 transition metal, which means that M is any one of V, Nb, and Ta. M is preferably any one of V, Nb, and Ta and more preferably Nb or Ta.

$R_1$, $R_2$, $R_3$, and $R_4$ are each independently hydrogen or a $C_{1-9}$ alkyl group or heteroalkyl group, and $R_1$, $R_2$, $R_3$, and $R_4$ are present or not present depending on the valency of $X_a$, $X_b$, and $X_c$. $R_1$, $R_2$, $R_3$, and $R_4$ may or may not be present, and when they are present, it means that they are each independently hydrogen or a $C_{1-9}$ alkyl group or heteroalkyl group.

The statement that $X_a$, $X_b$, and $X_c$ are each independently O, N, P, As, or —P=O means that $X_a$, $X_b$, and $X_c$ are each independently selected from among O, N, P, As, and —P=O and may be the same or different from one another.

In addition, the statement that $R_1$, $R_2$, $R_3$, and $R_4$ are each independently hydrogen or a $C_{1-9}$ alkyl group or heteroalkyl group and that $R_1$, $R_2$, $R_3$, and $R_4$ are present or not present depending on the valency of $X_a$, $X_b$, and $X_c$ means that $R_1$, $R_2$, $R_3$, and $R_4$ may be each independently present or not present so that the valency of $X_a$, $X_b$, and $X_c$ is satisfied. The statement also means that all the cases where all of $R_1$, $R_2$, $R_3$, and $R_4$, which are different substituents from one another, are present, all of them are not present, and one or more of them are present and one or more of them are not present are possible. Specifically, when $R_1$, $R_2$, $R_3$, and $R_4$ are each independently present, it means that these substituents may be selected so that they are the same or different from one another. For example, when $X_a$ is N, $R_1$ is present, and when $X_a$ is O, $R_1$ is not present.

In addition, the presence or absence of $R_2$, $R_3$, and $R_4$ may be determined by the presence or absence of B as well as the valency of $X_b$ and $X_c$. For example, when $X_b$ is N, $X_c$ is N, and B is present, $R_2$ is not present, and either one of $R_3$ and $R_4$ is present and the other is not present. As another example, when $X_b$ is N, $X_c$ is O, and B is present, all of $R_2$, $R_3$, and $R_4$ are not present.

In addition, the statement that A and B are each independently a $C_{1-9}$ alkylene group or heteroalkylene group and that B is present or not present depending on the valency of $X_b$ and $X_c$ means that the substituents A and B may be selected so that they are the same or different from each other and that B may or may not be present so that the valency of $X_b$ and $X_c$ is satisfied. For example, when $X_b$ is O, B is not present. In addition, the presence or absence of B may be determined by the presence or absence of $R_2$, $R_3$, and $R_4$ as well as the valency of $X_b$ and $X_c$. For example, when $X_b$ is N, $X_c$ is O, $R_2$ and $R_3$ are present, and $R_4$ is not present, B is not present. On the other hand, when $X_b$ is N, $X_c$ is O, and all of $R_2$, $R_3$, and $R_4$ are not present, B is present.

As described above, the presence or absence of $R_1$, $R_2$, $R_3$, $R_4$, $X_a$, $X_b$, $X_c$, and B may be determined without limitation within the above-described range, by the presence or absence and type of each substituent. Meanwhile, the "$C_{1-9}$ heteroalkyl group" does not refer to a heteroalkyl group having 1 to 9 carbon atoms and means that the number of carbon atoms and heteroatoms is in the range of 1 to 9. That is, the "$C_{1-9}$ heteroalkyl group" refers to a heteroalkyl group in which the sum of numbers of carbon atoms and heteroatoms is in the range of 1 to 9.

In addition, the heteroatom in the heteroalkyl group may be selected from among a wide variety of atoms typically capable of forming a stable substituent by being bonded to a carbon atom in an alkyl group, and is preferably N, O, or S. In addition, the number of the heteroatoms is not limited as long as it enables a stable organometallic compound to be formed while containing one or more carbon atoms, and when the sum of numbers of carbon atoms and the heteroatoms is in the range of 7 to 9, the number of the heteroatoms is preferably in the range of 1 to 8 and more preferably in the range of 1 to 4. In addition, when the sum of numbers of carbon atoms and the heteroatoms is in the range of 3 to 6, the number of the heteroatoms is preferably in the range of 1 to 5 and more preferably in the range of 1 to 2.

According to one embodiment of the present invention, $X_a$, $X_b$, and $X_c$ may be each independently O or N, and $R_1$, $R_2$, $R_3$, and $R_4$ may be each independently hydrogen or a $C_{1-6}$ alkyl group. More preferably, $X_a$, $X_b$, and $X_c$, are N, $R_1$, $R_2$, and $R_4$ are each independently hydrogen or a $C_{1-3}$ alkyl group, and $R_3$ is a $C_{4-6}$ alkyl group.

According to one embodiment of the present invention, A and B may be each independently a $C_{1-3}$ alkylene group or heteroalkylene group. More preferably, A and B are each independently a $C_{1-3}$ alkylene group, and even more preferably, A and B are each independently a $C_{1-2}$ alkylene group.

The description of each of the substituent units of Chemical Formulas 2 to 5 to be described below in this specification is consistent with the description of the same substituent units of Chemical Formula 1. Therefore, in the following description, contents overlapping with those described above will be omitted.

In addition, in order to solve the above-described problems, one aspect of the present invention provides an organometallic compound having a structure represented by the following Chemical Formula 2.

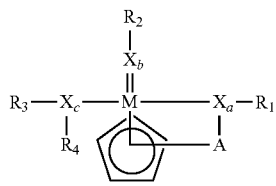

[Chemical Formula 2]

In Chemical Formula 2, M is selected from among Group 5 transition metals, $X_a$, $X_b$, and $X_c$ are each independently O, N, P, As, or —P=O, $R_1$, $R_2$, $R_3$, and $R_4$ are each independently hydrogen or a $C_{1-9}$ alkyl group or heteroalkyl group, and $R_1$, $R_2$, $R_3$, and $R_4$ are present or not present depending on the valency of $X_a$, $X_b$, and $X_c$, and A is a $C_{1-9}$ alkylene group or heteroalkylene group.

In addition, the Group 5 transition metal may be any one of V, Nb, and Ta, $X_a$, $X_b$, and $X_c$, may be each independently O or N, $R_1$, $R_2$, $R_3$, and $R_4$ may be each independently hydrogen or a $C_{1-6}$ alkyl group, and A may be a $C_{1-3}$ alkyl group or heteroalkyl group. More preferably, the Group 5 transition metal is Nb or Ta, $X_a$, $X_b$, and $X_c$ are each independently N, $R_1$, $R_3$, and $R_4$ are each independently hydrogen or a $C_{1-3}$ alkyl group, and $R_2$ is a $C_{3-6}$ alkyl group. Even more preferably, $R_1$, $R_3$, and $R_4$ are each independently a $C_{1-2}$ alkyl group, and $R_2$ is a $C_{4-5}$ alkyl group.

The statement that $R_1$, $R_2$, $R_3$, and $R_4$ are present or not present depending on the valency of $X_a$, $X_b$, and $X_c$ means that $R_1$, $R_2$, $R_3$, and $R_4$ may be each independently present or not present so that the valency of $X_a$, $X_b$, and $X_c$ is satisfied. The statement also means that all the cases where all of $R_1$, $R_2$, $R_3$, and $R_4$, which are different substituents from one another, are present, all of them are not present, and one or more of them are present and one or more of them are not present are possible. Specifically, when $R_1$, $R_2$, $R_3$, and $R_4$ are each independently present, it means that these substituents may be selected so that they are the same or different from one another. For example, when $X_a$ is N, $R_1$ is present, and when $X_a$ is O, $R_1$ is not present.

In addition, in order to solve the above-described problems, one aspect of the present invention provides an organometallic compound having a structure represented by the following Chemical Formula 3.

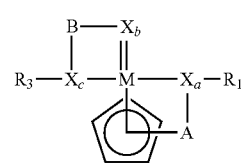

[Chemical Formula 3]

In Chemical Formula 3, M is selected from among Group 5 transition metals, $X_a$ and $X_c$ are each independently O, N, P, As, or —P=O, $X_b$ is N, P, As, or —P=O, $R_1$ and $R_3$ are each independently hydrogen or a $C_{1-9}$ alkyl group or heteroalkyl group, and $R_1$ and $R_3$ are present or not present depending on the valency of $X_a$ and $X_c$, and A and B are each independently a $C_{1-9}$ alkylene group or heteroalkylene group.

According to one embodiment of the present invention, the Group 5 transition metal may be any one of V, Nb, and Ta, $X_a$ and $X_c$ may be each independently O or N, $X_b$ may be N, $R_1$ and $R_3$ may be each independently hydrogen or a $C_{1-6}$ alkyl group, and A and B may be each independently a $C_{1-3}$ alkylene group or heteroalkylene group. More preferably, the Group 5 transition metal is Nb or Ta, all of $X_a$, $X_b$, and $X_c$ are N, $R^1$ and $R_3$ are each independently hydrogen or a $C_{1-3}$ alkyl group, and A and B are each independently a $C_{1-3}$ alkylene group. Even more preferably, $R^1$ and $R_3$ are each independently a $C_{1-2}$ alkyl group, and A and B are each independently a $C_{1-2}$ alkylene group.

In addition, one aspect of the present invention provides an organometallic compound having a structure represented by the following Chemical Formula 4.

[Chemical Formula 4]

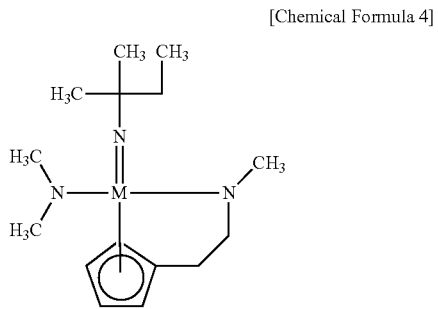

In Chemical Formula 4, M is Nb or Ta.

Furthermore, the organometallic compound is applicable to a wide variety of fields in which an organometallic compound is typically applicable, and is preferably applied or used in a process of manufacturing a semiconductor material in the semiconductor field. More preferably, the organometallic compound is used for manufacturing a metal-containing semiconductor thin film.

Specifically, the organometallic compounds are usable as precursors for forming semiconductor thin films. The precursor refers to a material in a state before it becomes a specific material through metabolism or a reaction, and a semiconductor thin film may be formed by physically/chemically adsorbing the organometallic precursor compound onto a substrate.

In addition, when used as a precursor, the organometallic compound of the present invention may be included as is in a metal-containing thin film or may be modified into a final form during the process. That is, when the organometallic compound of the present invention is used as a precursor for manufacturing a semiconductor thin film, the final form of the organometallic compound may vary.

That is, another aspect of the present invention provides a metal-containing thin film including the compounds described in the exemplary embodiments, and more particularly, a metal-containing thin film manufactured using one or more of the above-described organometallic compounds as precursors. Such a thin film has excellent uniformity and improved step coverage, and thus has the advantage of remarkably excellent efficiency.

In addition, still another aspect of the present invention provides a semiconductor construct including the above-described metal-containing thin film. Since such a semiconductor construct has excellent physical properties and is manufactured using a high-efficiency thin film, it has the advantages of higher stability and improved efficiency.

Meanwhile, in this regard, still another aspect of the present invention provides a method of manufacturing a metal-containing thin film, which includes: a) providing a vapor containing the above-described various types of organometallic compounds; and b) reacting the vapor with a substrate according to a deposition method and thereby forming a metal-containing complex layer on at least one surface of the substrate.

When the above-described manufacturing method is used, it is possible to improve stability and substrate adsorption efficiency at the time of forming a substrate and shorten the process time by increasing a thin-film deposition rate. In addition, it is possible to reduce contamination in the process, perform the process in a wider temperature range, and significantly improve the reliability and efficiency of the manufacturing process. Furthermore, through the use of the manufacturing method, it is possible to obtain a thin film having excellent uniformity and improved step coverage.

Hereinafter, a detailed description will be provided while excluding the contents overlapping with those described above.

First, the step a) of providing a vapor containing one or more of the above-described organometallic compounds will be described.

Into a heated vessel containing the organometallic compound of the present invention as a metal source, a carrier gas is introduced to realize the evaporation of the metal source. The vessel is preferably heated to a temperature capable of attaining a sufficient vapor pressure from the metal source. The carrier gas may be selected from among Ar, He, $H_2$, and $N_2$, and a mixture thereof. In the vessel, the metal source may be mixed with a solvent, another metal source, or a mixture thereof. The vessel is preferably heated at a temperature of 25° C. to 200° C., and by adjusting the temperature of the vessel, it is possible to control the evaporation amount of the precursor. The pressure in the vessel may be changed to control the level of evaporation in the vessel. The level of evaporation of the metal source may be increased by reducing the pressure in the vessel. Preferably, the pressure in the vessel is varied within the range of 1 Torr to 800 Torr.

In addition, the metal source in a liquid state may be supplied to an evaporator where evaporation occurs. The metal source may or may not be mixed with a solvent. Also, the metal source may be mixed with another metal source. This mixture of metal sources may be mixed with a solvent or a mixed solvent. The metal source may be mixed with a stabilizer. The solvent may be selected from the group consisting of an alkane such as hexane, heptane or octane, an aromatic solvent such as benzene, toluene, mesitylene or xylene, a silicon-containing solvent such as hexamethyldisiloxane, hexamethyldisilazane or tetramethylsilane, a sulfur-containing solvent such as dimethyl sulfoxide, and an oxygen-containing solvent such as tetrahydrofuran or dioxane. Meanwhile, the mixed solution including the solvent preferably contains the metal source in a concentration of 50 to 99.9% by weight.

Next, the step b) of reacting the vapor with a substrate according to a deposition method and thereby forming a metal-containing complex layer on at least one surface of the substrate will be described.

The vaporized metal source is introduced into a reaction chamber, where it is brought into contact with the surface of a substrate. The substrate may be heated to a temperature sufficient to produce a desired thin film having the desired physical state and composition at a sufficient growth rate. The substrate may generally be heated to a temperature suitable for producing the desired thin film, and the temperature is preferably in the range of 100° C. to 700° C. and more preferably 450° C. or less. Meanwhile, this process may be assisted by a plasma technique which is selected without limitation to improve the reactivity of the vaporized metal source and/or the reactivity of the other gas species used in the process.

Meanwhile, the deposition method of the step b) is not limited as long as it enables a metal-containing complex layer to be formed on a surface of the substrate, and is preferably a chemical vapor deposition (CVD) method or an atomic layer deposition (ALD) method.

First, the atomic layer deposition (ALD) method is a method of growing a thin film by cross-injecting a metal-containing raw material and a reaction gas, where the raw material and the gas are reacted to grow an atomic-level thin film, and this growth is repeated to adjust the thickness of the thin film. Specifically, the organometallic compound of the present invention used as a precursor may be injected into a vaporizer and then, while being in a vapor phase, delivered to a chamber. The vaporized film-forming composition may be delivered to the chamber. In this case, the precursor material may be volatilized so that the gas is delivered using a vapor pressure, delivered by a direct liquid injection method, or dissolved in an organic solvent and delivered through a liquid delivery system (LDS). In this case, as a diluent gas or a transport gas for transferring the precursor material to a substrate, one or more inert gases selected from among Ar, $N_2$, He, and $H_2$ are preferably used, and one or more inert gases selected from among Ar and $N_2$ are more preferably used. Meanwhile, a $N_2$ canister flow rate of 30 standard cubic centimeters per minute (SCCM) to 5000 SCCM is preferred, and a $N_2$ canister flow rate of 50 SCCM to 300 SCCM is more preferred.

Next, the transferred precursor material may be adsorbed onto the substrate, and a non-adsorbed precursor material may be purged. As the purge gas, an inert gas may be used. Subsequently, a reactant may be supplied. The reactant may include an oxidizing agent such as $H_2O$, $H_2O_2$, $O_2$, $O_3$, or $N_2O$. The reactant and the adsorbed precursor material may react to form a metal-containing thin film, and the thin film may include zirconium, titanium, hafnium, or the like. Subsequently, an unreacted material may be purged, and thereby excess reactants and generated by-products may be removed.

Meanwhile, the above-described adsorption, purging, supply of reactants, and purging are performed as one unit cycle. In order to form a thin film having a desired thickness, the unit cycle may be repeated. Preferably, the unit cycle is repeated 10 to 10,000 times.

In addition, when the ALD method is employed, it is preferably carried out in the temperature range of 100° C. to 450° C. and more preferably carried out in the temperature range of 150° C. to 350° C. In ALD, the pulse period is preferably 1 to 10 seconds, and the pressure is preferably 0.01 Torr to 800 Torr.

Next, the chemical vapor deposition (CVD) method is a method of forming, through a chemical reaction such as pyrolysis, photolysis, a redox reaction, or substitution, a thin film on a surface of a substrate by supplying gas containing an element constituting a material of a desired thin film to the substrate. When the CVD method is employed, it is preferably carried out in the temperature range of 100° C. to 700° C. and more preferably carried out in the temperature range of 200° C. to 500° C. Also, the pressure is preferably 0.01 Torr to 800 Torr and more preferably 1 Torr to 200 Torr. In addition, the carrier gas is preferably $N_2$, He, Ar, or $H_2$ and more preferably selected from among Ar and $N_2$. A preferred $N_2$ canister flow rate is 30 to 300 SCCM, and a more preferred $N_2$ canister flow rate is 50 SCCM to 100 SCCM.

Furthermore, still another aspect of the present invention provides a composition including one or more of the above-described organometallic compounds in an amount of 0.1% to 99.9% and one or more organic compounds selected from among saturated or unsaturated hydrocarbons, cyclic esters, acyclic ethers, esters, alcohols, cyclic amines, acyclic amines, cyclic sulfides, acyclic sulfides, phosphines, beta-diketones, and beta-ketoesters as the remainder and a method of manufacturing a metal-containing thin film using the same.

Manufacturing a metal-containing thin film using the composition containing the organometallic compound has an effect of improving the efficiency of adsorbing a compound onto a substrate, increasing stability, and shortening process time. In addition, since it is possible to control the physical properties and composition of the thin film being produced by adjusting the content of the composition, it is possible to easily manufacture a thin film suitable for applications and purposes.

In addition, it is possible to manufacture a barrier metal film having high coverage, ultra-thin qualities, and excellent barrier properties using the composition containing the organometallic compound.

Accordingly, in the present invention, since a novel organometallic compound is provided, it is possible to 1) increase the reliability and efficiency of the manufacturing process, 2) satisfy requirements of improved chemical/thermal stability, and at the same time, 3) achieve significantly improved thin-film deposition rates even at low temperatures. In addition, in the present invention, since an excellent organometallic compound as described above is used for manufacturing a metal-containing semiconductor thin film, it is possible to provide a metal-containing semiconductor thin film in which property degradation due to by-products is improved and excellent step coverage is realized, and which, due to having a high dielectric constant, electrically satisfies the equivalent oxide thickness (EOT) requirement while having a thickness at which tunneling does not physically occur and a semiconductor construct including the same.

Hereinafter, the present invention will be described in more detail through the following exemplary embodiments, but the following exemplary embodiments are provided to facilitate understanding of the present invention and should not be construed as limiting the scope of the present invention.

EXAMPLES

Example 1 (Nb)

(1) Preparation of Novel, Synthesized Compound

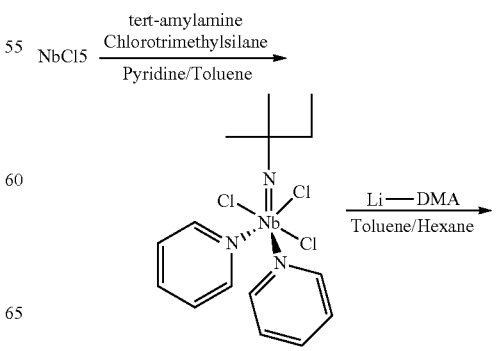

-continued

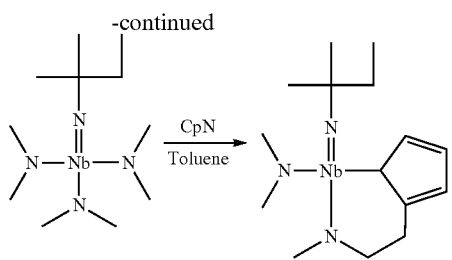

After dissolving 17 g of dimethylamine in toluene, the solution was added dropwise to 141 ml of a 2.5 M butyllithium solution at −20° C. and stirred at room temperature for two hours, and thereby a dimethylamine lithium salt was obtained (yield: 90%). After dissolving 32.7 g of tert-amylamine in toluene, 22.5 mL of chlorotrimethylsilane was added dropwise thereto and stirred for 15 minutes. After passing the reaction product through Celite, the reaction product was added dropwise to a reaction vessel containing 21.8 g of niobium chloride dissolved in toluene and stirred for one hour. Subsequently, 25 mL of pyridine was added dropwise and stirred for 12 hours. After passing the reaction product through Celite, the solvent was removed under reduced pressure, and thereby tert-amylamine niobium chloride (TANbCl) was obtained. After dissolving TANbCl in toluene, dimethylamine was added dropwise at −20° C. and refluxed for four hours. After passing the reaction product through Celite, the solvent was removed under reduced pressure. By purifying the reaction product under reduced pressure at 0.1 Torr and 100° C., niobium-dimethylamine (Nb-DMA) was obtained (yield: 57.9%). After dissolving 14.5 g of the Nb-DMA in toluene, 5.76 g of cyclopentadienylethylmethylamine was added dropwise thereto at −20° C. and stirred for one hour, and then the solvent was removed by distillation under reduced pressure, and thereby cyclopentadiene ethylmethylamide niobium(V) methylamide tert-amylamide (Map-Nb01) was obtained (yield: 44%).

Figure 1B:
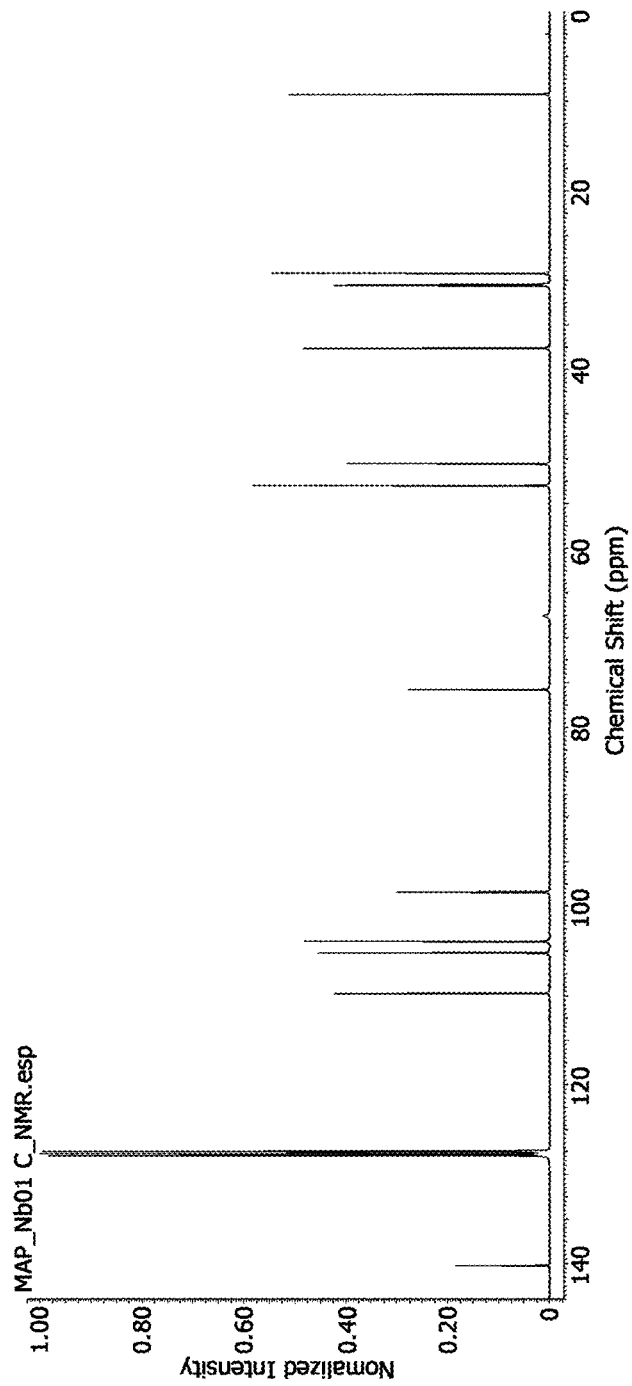

In addition, the $^1$H-NMR and $^{13}$C NMR measurement data of the obtained Map-Nb01 is shown in FIGS. 1A and 1B.

(2-1) Preparation of Metal-Containing Thin Film Using Map-Nb01 as Precursor (Example 1-1)

Map-Nb01 was provided as a precursor, and a silicon wafer was first immersed in a piranha solution in which sulfuric acid ($H_2SO_4$) and hydrogen peroxide ($H_2O_2$) were mixed in a 4:1 volume ratio for 10 minutes, taken out, and then immersed in a dilute aqueous HF solution for two minutes to prepare a pure silicon surface, and subsequently, an NbN film was deposited thereon by a plasma enhanced atomic layer deposition (PEALD) method. Here, the substrate was heated to a temperature of 300 to 450° C., and the precursor was diluted with octane to a viscosity of 4 to 10 cps, transferred to a vaporizer using a stainless steel vessel, and vaporized. Here, the supply time of the precursor into a reactor was set to 5 to 20 seconds, the flow rate of ammonia gas, which was a reducing agent, was set to 100 SCCM, and the supply time thereof was set to 5 to 20 seconds.

Argon, which was a purifying gas, was supplied for 30 seconds after each supply of the precursor and the ammonia gas. It can be seen that the thin-film manufacturing process using MAP-Nb1 of the present invention as a precursor and ammonia as a reducing agent has the characteristics of ALD. In addition, the deposition rate was about 0.43 Å/cycle, and the density of the film was 3.6 g/cm$^3$. A film having an Nb:N at % ratio (atomic percentage) close to 1:1 and a carbon content of less than 1.0% was obtained. The low rate was attributed to an extended purge time.

Both the carbon content and resistivity were dependent on the addition of ammonia. When the flow rate of ammonia was 25 SCCM, the film hardly contained carbon, whereas in the absence of ammonia, the carbon content was 30 at % (atomic concentration percentage) or more.

(2-2) Preparation of Metal-Containing Thin Film Using Map-Nb01 as Precursor (Example 1-2)

Map-Nb01 was provided as a precursor, and a silicon wafer was first immersed in a piranha solution in which sulfuric acid ($H_2SO_4$) and hydrogen peroxide ($H_2O_2$) were mixed in a 4:1 volume ratio for 10 minutes, taken out, and then immersed in a dilute aqueous HF solution for two minutes to prepare a pure silicon surface, and subsequently, an $Nb_2O_5$ film was deposited thereon by an atomic layer deposition (ALD) method. Here, the substrate was heated to a temperature of 150 to 400° C., and the precursor was diluted with octane to a viscosity of 4 to 10 cps, transferred to a vaporizer using a stainless steel vessel, and vaporized. Here, the supply time of the precursor into a reactor was set to 3 to 7 seconds, the flow rate of ozone gas, which was an oxidizing agent, was set to 500 SCCM, and the supply time thereof was set to 3 to 7 seconds.

Argon, which was a purifying gas, was supplied for 5 to 7 seconds after each supply of the precursor and the ozone gas. It can be seen that the thin-film manufacturing process using MAP-Nb01 of the present invention as a precursor and ozone as an oxidizing agent has the characteristics of ALD. In addition, the deposition rate was about 0.66 Å/cycle, and the density of the film was 4.4 g/cm$^3$. A film having an Nb:O at % ratio close to 2:5 and a carbon content of less than 1.0% was obtained.

Example 2 (Ta)

(1) Preparation of Novel, Synthesized Compound

[Reaction Scheme 2]

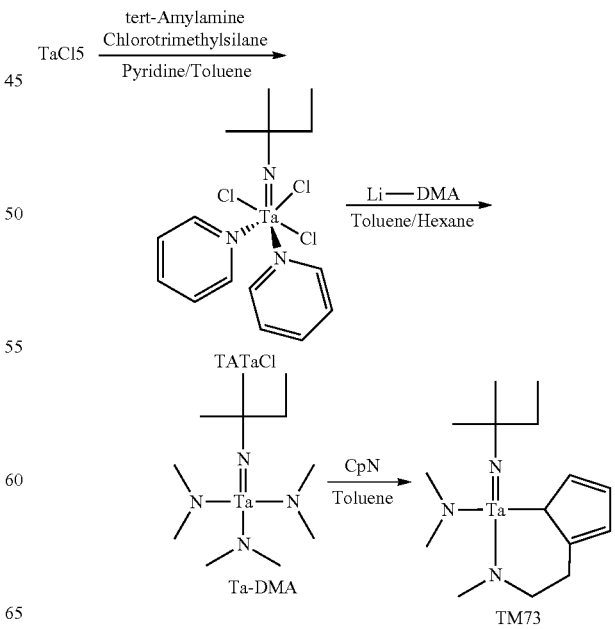

After dissolving 17 g of dimethylamine in toluene, the solution was added dropwise to 141 mL of a 2.5 M butyllithium solution at −20° C. and stirred at room temperature for two hours, and thereby a dimethylamine lithium salt was obtained (yield: 90%). After dissolving 32.7 g of tert-amylamine in toluene, 22.5 mL of chlorotrimethylsilane was added dropwise thereto and stirred for 15 minutes. Subsequently, after passing the reaction product through Celite, the reaction product was added dropwise to a reaction vessel containing 28.66 g of tantalum chloride dissolved in toluene and stirred for one hour. Subsequently, 20 mL of pyridine was added dropwise and stirred for 12 hours. Subsequently, after passing the reaction product through Celite, the solvent was removed under reduced pressure, and thereby tert-amylamide tantalum(V) chloride (TATaCl) was obtained. Subsequently, after dissolving TATaCl in toluene, 13.5 g of dimethylamine was added dropwise thereto at −20° C. and refluxed for four hours. Subsequently, after passing the reaction product through Celite, the solvent was removed under reduced pressure. Subsequently, by purifying the reaction product under reduced pressure at 0.1 Torr and 100° C., tantalum-dimethylamine (Ta-DMA) was obtained (yield: 30%). Subsequently, after dissolving 9.48 g of the Ta-DMA in toluene, 2.93 g of cyclopentadienylethylmethylamine was added dropwise thereto at −20° C. and stirred for one hour, and then the solvent was removed by distillation under reduced pressure, and thereby cyclopentadiene ethylmethylamide tantalum(V) methylamide tert-amylamide (Map-Ta01) was obtained (yield: 20%).

Figure 2A:
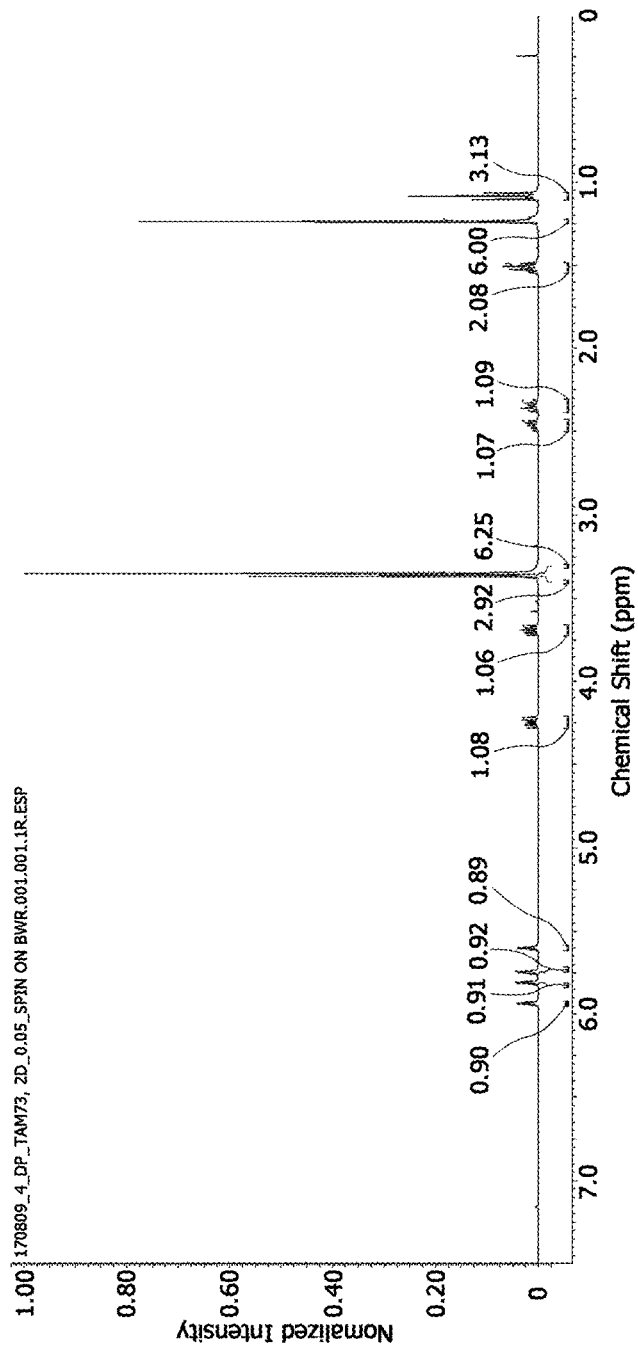
FIGS. 2A and 2B show the $^1$H-NMR and $^{13}$C-NMR measurement data of Map-Ta01 prepared in Example 2, respectively.
Figure 2B:
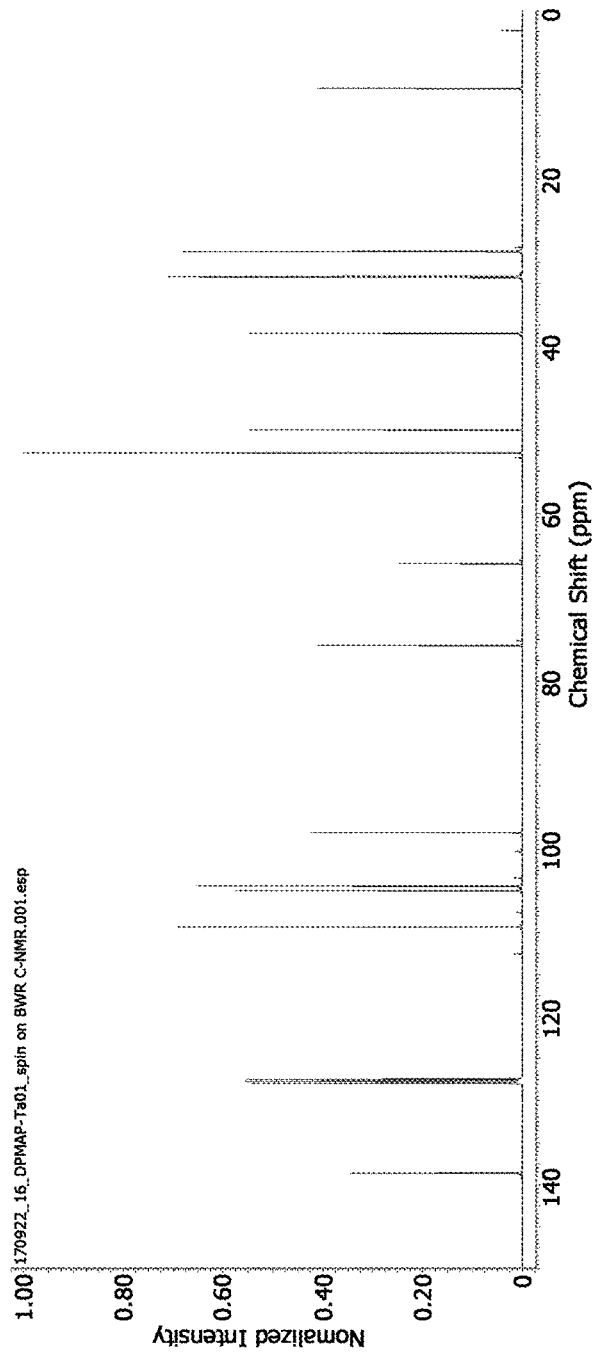

In addition, the $^1$H-NMR and $^{13}$C NMR measurement data of the obtained Map-Ta01 is shown in FIGS. 2A and 2B.

(2) Preparation of Metal-Containing Thin Film Using Map-Ta01 as Precursor

Map-Ta01 was provided as a precursor, and a silicon wafer was first immersed in a piranha solution in which sulfuric acid ($H_2SO_4$) and hydrogen peroxide ($H_2O_2$) were mixed in a 4:1 volume ratio for 10 minutes, taken out, and the immersed in a dilute aqueous HF solution for two minutes to prepare a pure silicon surface, and subsequently, a TaN film was deposited thereon by a plasma enhanced atomic layer deposition (PEALD) method. Here, the substrate was heated to a temperature of 300 to 450° C., and the precursor was diluted with octane to a viscosity of 4 to 10 cps, transferred to a vaporizer using a stainless steel vessel, and vaporized. Here, the supply time of the precursor into a reactor was set to 5 to 20 seconds, the flow rate of ammonia gas, which was a reducing agent, was set to 25 to 100 SCCM, and the supply time thereof was set to 5 to 20 seconds. Argon, which was a purifying gas, was supplied for 30 seconds after each supply of the precursor and the ammonia gas. It can be seen that the thin-film manufacturing process using MAP-Ta01 of the present invention as a precursor and ammonia as a reducing agent has the characteristics of ALD. The deposition rate was about 0.46 Å/cycle, and the density of the film was 6.45 g/cm$^3$.

A film having a Ta:N at % ratio close to 1:1 and a carbon content of less than 1.0% was obtained. The low rate was attributed to an extended purge time. In depositing a tantalum nitride film, at a temperature of 300 to 375° C., a very nitrogenous thin film was obtained, but in view of the fact that its resistivity was quite low (12,000 μΩ·cm at an NH$_3$ flow rate of 25 SCCM) and the presence of TaN was clearly apparent, it is considered that the thin film was a TaN phase rather than a Ta$_3$N$_5$ phase. Both the carbon content and the resistivity were dependent on the addition of ammonia. When the flow rate of ammonia was 25 SCCM, the film hardly contained carbon, whereas in the absence of ammonia, the carbon content was 30 at % or more.

Examples 3 to 15

Synthesis was performed in the same manner as in Example 1, except that an organometallic compound having a structure represented by the following Chemical Formula 5 and having substituents shown in Table 1 to Table 3 was synthesized and used as a precursor.

[Chemical Formula 5]

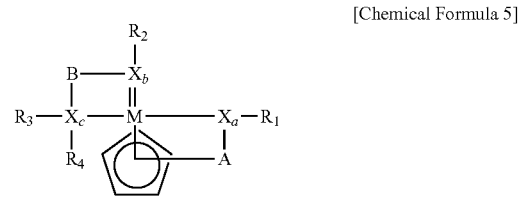

In addition, the compounds synthesized through Examples 1 to 15 and used as precursors are shown below. Here, among the following Chemical Formulas, one that is labeled with the numeral 1 corresponds to the compound of Example 1, and, as such, the compounds and Examples having the same numerals correspond to each other.

[Chemical Formula]

1

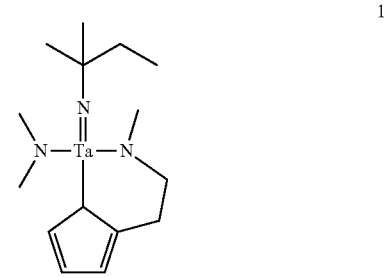

2

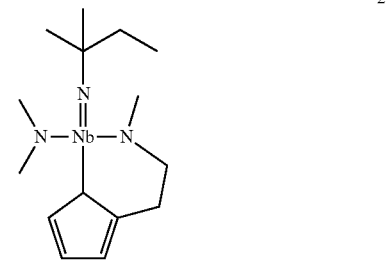

3

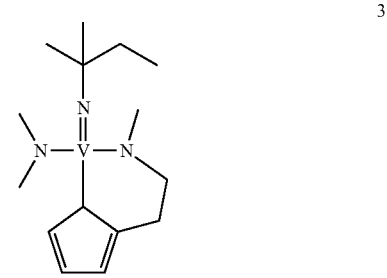

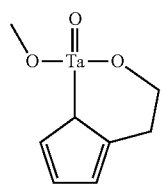
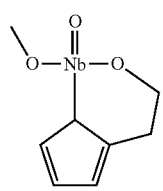
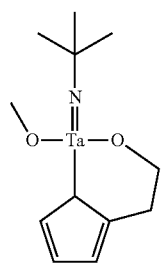
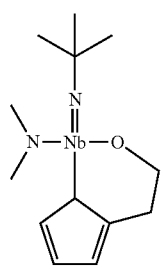
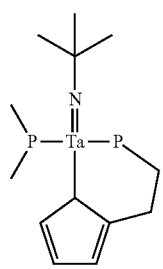
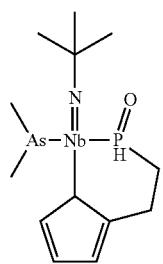
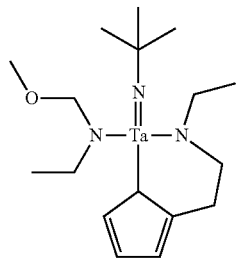
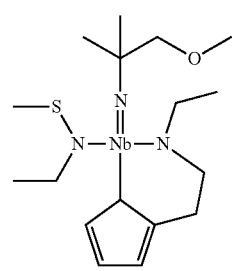
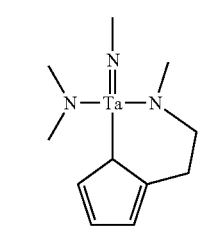
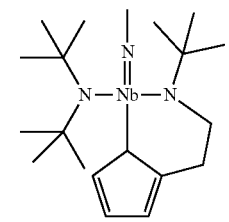
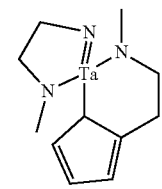
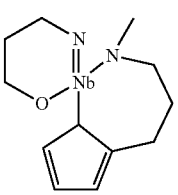

TABLE 1

| Classification | Examples 1-1 and 1-2 | Example 2 | Example 3 | Example 4 | Example 5 | Example 6 | Example 7 |
|---|---|---|---|---|---|---|---|
| M | Ta | Nb | V | Ta | Nb | Ta | Nb |
| $X_a$ | N | N | N | O | O | O | O |
| $X_b$ | N | N | N | O | O | N | N |
| $X_c$ | N | N | N | O | O | O | N |
| $R_1$ | —$CH_3$ | —$CH_3$ | —$CH_3$ | Not present | Not present | Not present | Not present |
| $R_2$ | [branched structure] | [branched structure] | [branched structure] | Not present | Not present | [branched structure] | [branched structure] |
| $R_3$ | —$CH_3$ | —$CH_3$ | —$CH_3$ | —$CH_3$ | —$CH_3$ | —$CH_3$ | —$CH_3$ |
| $R_4$ | —$CH_3$ | —$CH_3$ | —$CH_3$ | Not present | Not present | Not present | —$CH_3$ |
| A | —$(CH_2)_2$— | —$(CH_2)_2$— | —$(CH_2)_2$— | —$(CH_2)_2$— | —$(CH_2)_2$— | —$(CH_2)_2$— | —$(CH_2)_2$— |
| B | Not present | Not present | Not present | Not present | Not present | Not present | Not present |

TABLE 2

| Classification | Example 8 | Example 9 | Example 10 | Example 11 | Example 12 | Example 13 | Example 14 |
|---|---|---|---|---|---|---|---|
| M | Ta | Nb | Ta | Nb | Ta | Nb | Ta |
| $X_a$ | P | —P=O | N | N | N | N | N |
| $X_b$ | N | N | N | N | N | N | N |
| $X_c$ | P | As | N | N | N | N | N |
| $R_1$ | —$CH_3$ | —$CH_3$ | —$C_2H_5$ | —$C_2H_5$ | —$CH_3$ | [branched structure] | —$CH_3$ |
| $R_2$ | [branched structure] | [branched structure] | [branched structure] | [branched structure with —O—] | —$CH_3$ | —$CH_3$ | Not present |
| $R_3$ | —$CH_3$ | —$CH_3$ | —$CH_2$—O—$CH_3$ | —$CH_2$—S—$CH_3$ | —$CH_3$ | [branched structure] | Not present |
| $R_4$ | —$CH_3$ | —$CH_3$ | —$C_2H_5$ | —$C_2H_5$ | —$CH_3$ | [branched structure] | —$CH_3$ |
| A | —$(CH_2)_2$— | —$(CH_2)_2$— | —$(CH_2)_2$— | —$(CH_2)_2$— | —$(CH_2)_2$— | —$(CH_2)_2$— | —$(CH_2)_2$— |
| B | Not present | Not present | Not present | Not present | Not present | Not present | —$(CH_2)_2$— |

TABLE 3

| Classification | Example 15 |
|---|---|
| M | Nb |
| $X_a$ | N |
| $X_b$ | N |
| $X_c$ | O |
| $R_1$ | —$CH_3$ |
| $R_2$ | Not present |
| $R_3$ | Not present |
| $R_4$ | Not present |
| A | —$(CH_2)_4$— |
| B | —$(CH_2)_4$— |

Experimental Example 1—Measurement of Thin-Film Deposition Rates

For the thin films manufactured according to Examples 1 to 15, thin-film deposition rates per ALD cycle were measured. The results are shown in Table 4.

Experimental Example 2—Evaluation of Step Coverage Improvement Effects

Step coverage improvement effects in the thin films manufactured according to Examples 1 to 15 were evaluated. The results are shown in Table 4.

Experimental Example 3—Evaluation of Purity Improvement Effect in Deposited Thin Films Compositions of the thin films manufactured according to Examples 1 to 15 were analyzed using an Auger Electron Spectroscopy (AES) instrument to measure the contents of carbon and nitrogen contaminants in the films. The results are shown in Table 4.

TABLE 4

| Classification | Thin-film deposition rate (%) | Thin-film step coverage (%) | Thin-film purity Carbon (at %) |
|---|---|---|---|
| Example 1-1 | 0.46 | 94.8 | 0.9 |
| Example 1-2 | 0.66 | 95.3 | 0.9 |
| Example 2 | 0.43 | 95.7 | 0.9 |
| Example 3 | 0.47 | 94.6 | 0.9 |
| Example 4 | 0.40 | 94.6 | 1.2 |
| Example 5 | 0.39 | 95.7 | 1.1 |
| Example 6 | 0.41 | 94.8 | 1.4 |
| Example 7 | 0.38 | 95.7 | 1.0 |
| Example 8 | 0.37 | 94.8 | 1.3 |
| Example 9 | 0.39 | 95.7 | 1.1 |
| Example 10 | 0.45 | 92.2 | 1.2 |
| Example 11 | 0.46 | 93.5 | 1.1 |
| Example 12 | 0.44 | 92.1 | 1.0 |
| Example 13 | 0.43 | 93.3 | 1.0 |
| Example 14 | 0.44 | 92.0 | 1.3 |
| Example 15 | 0.41 | 93.6 | 1.2 |

Referring to Table 4, it can be seen that all the thin films manufactured using the organometallic compounds of the present invention as precursors have significantly improved thin-film deposition rates of more than 0.35 (Å/cycle). It can also be seen that even when the organometallic compounds are substituted with alkyl groups having somewhat shorter chain lengths such as heteroalkyl groups or methyl groups as in the cases of Examples 10 to 13, excellent thin-film deposition rates of 0.40 (Å/cycle) or more are exhibited.

In addition, it can be seen that all the thin films have significantly improved thin-film step coverage of more than 92%. It can be seen that even when $X_a$, $X_b$, and $X_c$ are O, P, As, or —P=O other than nitrogen as in the cases of Examples 4 to 9, an excellent thin-film step coverage of 94.6% or more is exhibited.

Furthermore, in regard to the thin-film purity, it is observed that the content of a carbon contaminant in all films is 1.3 at % or less, and from this result, it can be seen that according to the present invention, it is possible to provide a thin film which has improved purity due to including a remarkably small amount of remaining impurities.

The invention claimed is:

1. An organometallic compound having a structure represented by the following Chemical Formula 2:

[Chemical Formula 2]

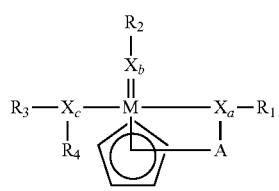

wherein, in Chemical Formula 2, M is any one of V, Nb, and Ta; $X_a$, $X_b$, and $X_c$ are each independently O, N, P, As, or —P=O; $R_1$, $R_2$, $R_3$, and $R_4$ are each independently hydrogen or a $C_{1-9}$ alkyl group or heteroalkyl group, and $R_1$, $R_2$, $R_3$, and $R_4$ are present or not present depending on the valency of $X_a$, $X_b$, and $X_c$; and A is a $C_{1-9}$ alkylene group or heteroalkylene group, with the proviso that $X_a$ and $X_c$ are not both N.

2. The organometallic compound of claim 1, wherein M is any one of V, Nb, and Ta; $X_a$ is O, P, or —P=O; $X_b$ is O or N; $X_c$ is O, N, P, or As; $R_1$, $R_2$, $R_3$, and $R_4$ are each independently hydrogen or a $C_{1-6}$ alkyl group, and A is a $C_{1-3}$ alkylene group or heteroalkylene group.

* * * * *